United States Patent [19]
Atwood et al.

[11] Patent Number: 5,386,388
[45] Date of Patent: Jan. 31, 1995

[54] SINGLE CELL REFERENCE SCHEME FOR FLASH MEMORY SENSING AND PROGRAM STATE VERIFICATION

[75] Inventors: Gregory E. Atwood, San Jose; Owen W. Jungroth, Sonora; Neal R. Mielke, Los Altos Hills; Branislav Vajdic, Los Gatos, all of Calif.

[73] Assignee: Intel Corporation, Santa Clara, Calif.

[21] Appl. No.: 85,127

[22] Filed: Jun. 28, 1993

Related U.S. Application Data

[63] Continuation of Ser. No. 620,149, Nov. 30, 1990, abandoned.

[51] Int. Cl.⁶ .............................................. G11C 11/34
[52] U.S. Cl. .............................. 365/201; 365/189.09; 365/218
[58] Field of Search ................... 365/218, 189.09, 201

[56] References Cited

U.S. PATENT DOCUMENTS

| | | | |
|---|---|---|---|
| 3,660,819 | 5/1972 | Frohman-Bentchkowsky | 365/185 |
| 3,755,721 | 8/1973 | Frohman-Bentchkowsky | 357/315 |
| 4,099,196 | 7/1978 | Simko | 365/218 |
| 4,100,437 | 7/1978 | Hoff, Jr. | 307/297 |
| 4,203,158 | 5/1980 | Frohman-Bentchkowsky | 365/185 |
| 4,223,394 | 9/1980 | Pathak et al. | 365/210 |
| 4,287,570 | 9/1981 | Stark | 365/104 |
| 4,460,982 | 7/1984 | Gee et al. | 565/218 |
| 4,763,305 | 8/1988 | Kuo | 365/218 |
| 4,875,188 | 10/1989 | Jungroth | 365/185 |
| 4,943,948 | 7/1990 | Morton et al. | 365/201 |
| 5,031,145 | 7/1991 | Lever | 365/210 |
| 5,043,940 | 8/1991 | Harari | 365/218 |
| 5,163,021 | 11/1992 | Mehrotra et al. | 365/185 |
| 5,172,338 | 12/1992 | Mehrotra et al. | 365/201 |

*Primary Examiner*—Do H. Yoo
*Attorney, Agent, or Firm*—Blakely, Sokoloff, Taylor & Zafman

[57] ABSTRACT

A reference scheme for verifying the erasing and programming in an electrically erasable and electrically programmable read-only memory fabricated on a silicon substrate which employs a plurality of memory cells, each of which contains a floating gate. The reference scheme employs trimmable single cell reference devices for both the erase verify and program verify operations. The threshold voltages of the reference cells are trimmed to a level below (in the case of the erase verify reference cell) or above (in the case of the program verify reference cell) which all memory cells in the array will be considered in a particular program state (i.e., erased or programmed). In the case of the read reference device, a double-cell read referencing device combining the erase and program verify reference cells is described. Although, the double-cell referencing device is preferred, a trimmable read reference device is also taught.

24 Claims, 4 Drawing Sheets

FIG_3 (PRIOR ART)

ARRAY REFERENCE

FIG_4

FIG_6

FIG_7

SINGLE CELL REFERENCE SCHEME FOR FLASH MEMORY SENSING AND PROGRAM STATE VERIFICATION

This is a continuation of application Ser. No. 07/620,149, filed Nov. 30, 1990, now abandoned.

FIELD OF THE INVENTION

The invention relates to the field of metal-oxide semiconductor (MOS) electrically programmable read-only memories (EPROMs) and electrically erasable and electrically programmable read-only memories (EEPROMs); particularly to the field of "flash" EPROMs and EEPROMs.

BACKGROUND OF THE INVENTION

Metal-oxide semiconductor (MOS) electrically programmable read-only memories (EPROMs) frequently use memory cells that have electrically isolated gates commonly referred to as floating gates. These floating gates are most often completely surrounded by oxide and formed from a polycrystalline silicon (i.e., polysilicon) layer. Information is stored in the memory cells or devices in the form of a charge on the floating gate. Charge is transported to the floating gates by a variety of mechanisms such as avalanche injection, channel injection, tunneling, etc., depending on the construction of the cells. These cells are generally erased by exposing the array to ultraviolet (UV) radiation. An example of these cells can be found in U.S. Pat. Nos. 3,500,142; 3,660,819; 3,755,721; and 4,099,196.

In cells which are both electrically erasable and electrically programmable (e.g., EEPROMs), charge is placed onto and removed from the floating gate via tunneling of electrons through a thin gate oxide region formed over the substrate (see, by way of example, U.S. Pat. No. 4,203,158). In other instances, charge is removed through an upper control electrode as described in U.S. Pat. No. 4,099,196.

More recently, a new category of electrically erasable devices has emerged, and the devices are frequently referred to as "flash" EPROMs or "flash" EEPROMs. In these memories, memory cells are erased electrically, whereas the cells themselves comprise only a single device per cell. Also, erasing of the entire array or a block of individual memory cells may be accomplished.

EPROMs, including "flash" EPROMs, are conventionally removed from their printed circuit boards for both erasing and programming, while EEPROMs and "flash" EEPROMs are typically programmed and erased while installed in the same circuit (e.g., printed circuit board) used for reading data from the memory. Thus, a special programming device is unnecessary in the case of the EEPROM varieties. In some circumstances, "on chip" circuits are employed to verify that the programming and erasing operations have been performed properly. For instance, U.S. Pat. No. 4,460,982 disclosed an "intelligent" EEPROM which provides means for verifying both programming and erasing.

In accomplishing erase and program verification, a variety of sense amplifiers are used in the prior art to sense the state of the memory cells. To accomplish verification by sensing, a current is generated by the memory cell being verified by application of a gate potential to its word line. The current is compared to a current from a reference cell by the sense amplifier. Typically, EPROMs employ a column of UV-erased cells, identical in structure to the memory cells, which act as these reference cells. One column may exist for the array or for each I/O. Multiple column arrangements for each I/O have also been implemented in the prior art. All of the reference column arrangements associate at least one reference cell with each row of memory cells. The sense amplifier determines whether the memory cell being verified is drawing more or less current than the reference cell which is weighted in some relationship to the memory cell. In doing so, the sense amplifier verifies the program state of the memory cell.

Since both the memory cell and the reference cell of the typical EPROM are UV-erased, each has a different distribution of currents. Normally, this difference in distribution prevents the currents from being compared directly because of the possibility that an erased cell being verified could appear to be programmed and vice versa. To resolve the problem, a resistive load is used to effectively divide or weight the reference current. The typical load used is one-half or one-third that of the load for the memory cell, and the resulting 2 to 1 or 3 to 1 ratio is referred to as the sense amplifier ratio (SAR). Thus, in the prior art, the comparison of currents was done with an SAR of other than 1 to 1.

With an SAR of other than 1 to 1, the verification of the erasing and programming of a memory cell by a sense amplifier relying on a current from a single cell reference depends on the threshold voltages of both the reference cell and the memory cell, as well as the gate potential applied to each (i.e., for a 3 to 1 SAR, $V_{WL1}=1.5*V_{tla}-0.5*V_{tlr}$, as derived later using Equations 1,2 and 3 found in the Detailed Description of the Invention). The flash memories are usually programmed and erased in iterative loops that extend the program and erase operations until the verification condition, and thus the above equation, is met. The resulting array threshold voltage is given by $V_{tla}=(\frac{2}{3})V_{WL1}+(\frac{1}{3})*V_{tlr}$.

Accurate control of $V_{tla}$ is important because it determines product speed and other factors. In view of the above equation, in order to accurately place (i.e., control) $V_{tla}$ for erase and program verification, very good control of the word line voltage is required. Also, the nature of the equation is such that if temperature is changed, the tracking of the reference cell with the array, due to the non-ideal load ratio, is difficult. The difficulty is due to the changes occurring to the threshold voltages not canceling each other out. This puts further requirements on the word line voltage to track temperature in order to accommodate the difference created by the absence of a 1 to 1 ratio, which does not occur in the state of the art.

Finally, memory cells cannot be verified at any voltage lower than the reference cell threshold because the reference cell will shut down (turn off). The equation depicting the relationship between the reference cell current and the memory cell current is not valid where the gate potential ($V_{WL1}$) approaches the threshold voltage ($V_{tlr}$) of the reference cell.

As will be seen, the present invention involves a single cell reference scheme for flash memory sensing for read operations and program/erase verifications which achieves temperature and process tracking for program/erase verification by matching the resistive loads in a 1 to 1 relationship (SAR). This allows the invention to be insensitive to control gate voltages.

SUMMARY OF THE INVENTION

A circuit for verifying the erasing and the programming in an electrically erasable and electrically programmable read-only memory (EEPROM) array fabricated on a silicon substrate and having a plurality of memory cells, each of which contains a floating gate is described. In one embodiment, a first circuit means incorporated on the substrate is coupled to the word line of the memory cell. The first circuit means presents a first single cell referencing device, matched to the array memory cell, which is used to verify whether the cells in the array have been programmed. The threshold voltage of this single cell referencing device is trimmed to the level above which all cells in the array are considered programmed. A gate potential applied to the word line puts the memory cell being verified into conduction, as well as the first trimmable referencing device. These currents are compared indirectly by a sense amplifier using equal resistance coupled to both the memory cell and the first trimmable reference device to create potentials representing the currents. Simply, where the threshold voltage of the memory cell being verified is greater than the threshold voltage of the first trimmable reference device, the memory cell draws less current than the first trimmable reference device and, the sense amplifier produces a signal indicating that the memory cell has been verified as programmed.

A second circuit means is also incorporated on the substrate and is coupled to the word line of the memory cell. The second circuit means presents a second single cell referencing device, matched to the array memory cell, which is used to verify whether the cells in the array have been erased. The threshold voltage of this single cell referencing device is trimmed to the level below which all cells in the army are considered erased. A gate potential applied to the word line puts the memory cell being verified into conduction, as well as the second trimmable referencing device. These currents are compared indirectly by a sense amplifier using equal resistance coupled to both the memory cell and the second trimmable reference device to create potentials representing the currents. Simply, where the threshold voltage of the memory cell being verified is less than the threshold voltage of the second trimmable reference device, the memory cell draws more current than the reference cell, and the sense amplifier produces a signal indicating that the memory cell has been verified as erased.

A third referencing cell to accommodate the read operation can also take the form of a trimmable single cell referencing device where its threshold voltage is trimmed to a level optimized for read speed and other product considerations. In the preferred embodiment, two single cell referencing devices can be coupled in parallel such that ordinary transistor switching allows the combination of the two devices to support the read operation, while also allowing the two referencing cells to continue with their individually designated operations.

A switch is used to couple either reference cell, or both (in the case of the double-cell read reference), to the sense amplifier according to which operation is being undertaken.

DETAILED DESCRIPTION OF THE PRESENT INVENTION

A circuit for verifying the erasing and programming in an electrically erasable and electrically programmable read-only memory cell is described. In the following description numerous specific details are set forth such as a specific device types, voltages, etc., in order to provide a thorough understanding of the present invention. It will be obvious, however, to one skilled in the art that the present invention may be practiced without these specific details. In other instances, well-known processes and circuits have not been described in detail to avoid unnecessarily obscuring the present invention.

Normally, the memory devices in the typical "flash" EPROMs are programmed (i.e., negative charge is placed on a floating gate) by coupling the word line or control gate of the memory cell to a potential of approximately 12 volts, the drain region to approximately 7 volts, and the source region to ground. Under these conditions, channel hot electron injection occurs through the oxide layer of the memory cell. Typically, memory cells are programmed to a threshold voltage over 5.5 volts. To erase the cell, the drain is floated, the word line or control gate is grounded and a potential of approximately 12 volts is applied to the source region. Under these conditions, charge tunnels from the floating gate into the substrate. During the reading of the cell, a positive potential (less than that which would cause charge to transfer onto the floating gate) is applied to the control gate and a low potential (less than that which would cause charge to tunnel into the substrate, e.g., 1 volt) is applied to the drain region. Current through the device is sensed to determine the charge on the floating gate. Negative charge on the floating gate shifts the threshold voltage of the device up, making it less conductive. Thus, with a sense amplifier and a reference cell (or cells), the charge on the floating gate can be determined.

To verify whether a memory cell has been erased or programmed, the threshold voltage of the cell must be ascertained. Therefore, a current through the memory cell must be created. Once created, the current is compared to a reference current. The reference current is set to specific level such that the memory cell drawing more or less current indicates that the memory cell is erased or programmed respectively. Thus, verification of the memory cell depends on the amount of current drawn by the memory cell with respect to the reference cell current.

The basic idea of the referencing scheme in the present invention is to use separate reference devices for both the erase and program verification. In the case of the erase verify operation, the threshold voltage of the erase reference cell is "trimmed" to a level below which a "flash" EPROM cell is considered erased. In other words, the threshold voltage of the erase reference cell is set to the point where a memory cell having a threshold voltage less than the erase reference cell is considered erased. If both the array memory cell and the erase reference cell are put into conduction, the cell with the lower threshold potential draws more current. Therefore, the memory cell is verified if it draws more current than the erase reference cell. Similarly, for the program verify operation, the threshold voltage of the program verify reference device is "trimmed" to a level above which a "flash" EPROM cell is considered programmed. Thus, when both the memory cell and the program verify reference cell are put into conduction, the memory cell is considered verified where it draws less current than the reference cell.

In the prior art, the reference cells in the reference column used for verification had their threshold voltages set by UV-erased, instead of electrical trimming.

Figure 1:
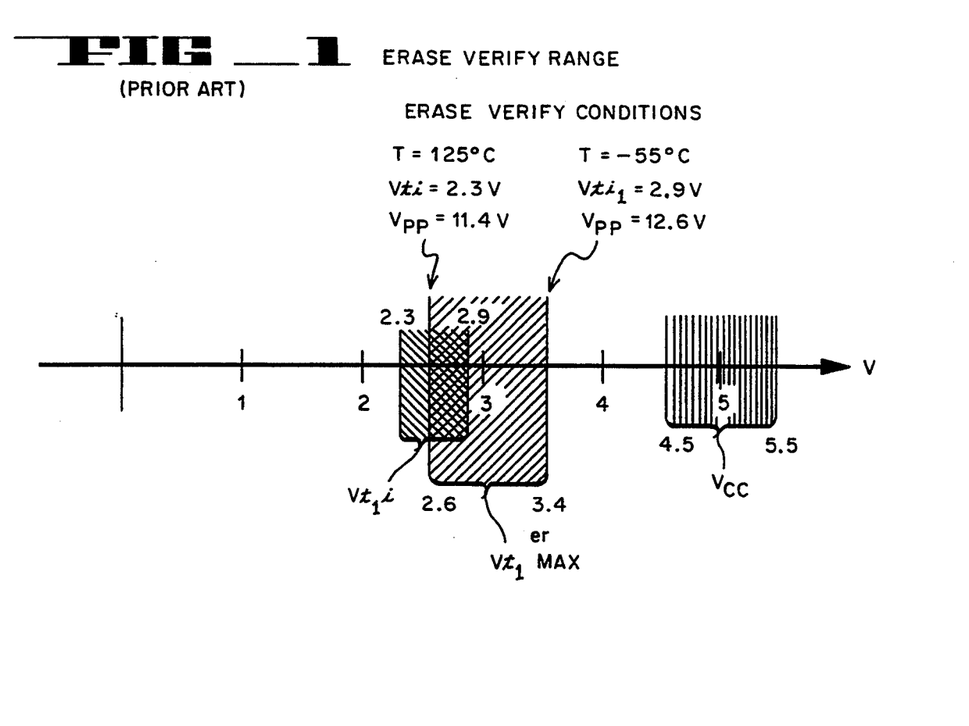
FIG. 1 is a plot of the erase verify range for a typical prior art EPROM cell.

Referring to FIG. 1, the range of threshold voltages for the typical UV-erased EPROM reference cell, $V_{ti}$, is 2.6±0.3 volts. The array erase distribution is subject to changes in temperature (ranging from 125° C. to −55° C.) and power supply voltage (12V ±0.6V). In the prior art referencing schemes, the top of the erase distribution is determined by the gate voltage that is being applied to during the erase verify operation. The top of the erase array distribution ($V_{t1}{}^{er}$, max) is at 3V ±0.4V based on these considerations. The present invention avoids the uncertainty in the position of the erase distribution of the prior art by fixing it to the erase reference device threshold voltage. Therefore, the position of the array erase distribution is not subject to changes in temperature, program/erase power supply voltage ($V_{pp}$), nor gate.

Figure 2:
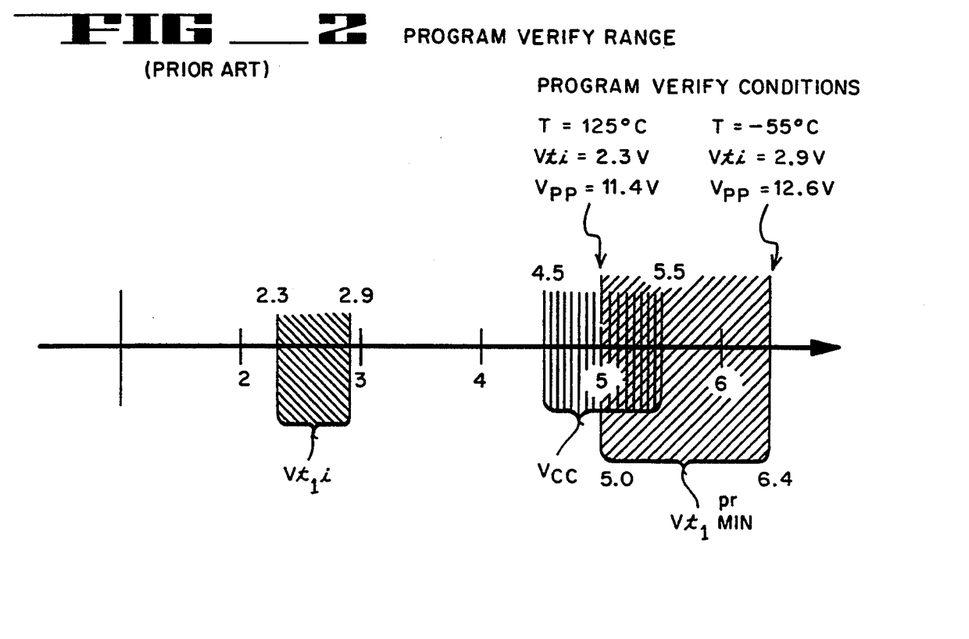
FIG. 2 is a plot of the program verify range for a typical prior art EPROM cell.

Similarly, FIG. 2 displays the program distribution of the typical prior art EPROM cell. The same uncertainty exists with respect to temperature changes and program/erase power supply, $V_{pp}$. The corresponding bottom of the program distribution ($V_{t}{}^{pr}$,min) is at 5.7V ±0.7V. The present invention avoids the uncertainty by making the bottom of the program distribution of the flash EPROM cells fixed to the threshold voltage of the program verify device. Accordingly, the threshold voltage of the program verify reference device is set to the desired bottom of the program distribution minimum.

Figure 3:
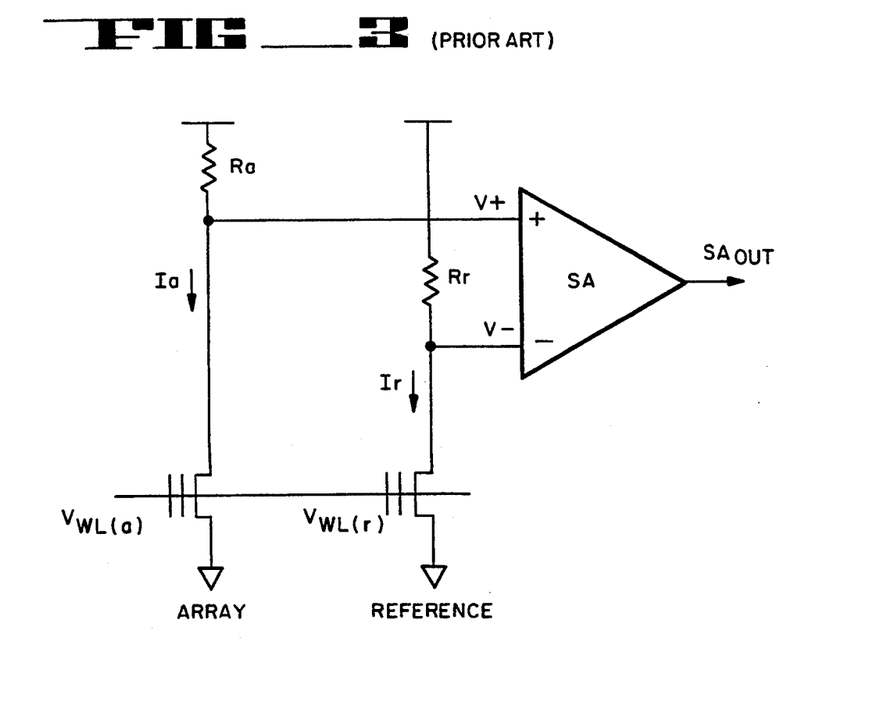
FIG. 3 is a simplified circuit schematic of the prior art sensing circuitry.

FIG. 3 represents a simplified diagram of the sensing circuitry for the prior art. Memory cell 10 is a transistor which represents the typical array cell in the "flash" EPROMs. The gate of memory cell 10 is attached to word line 12a, and the drain is coupled to sense amplifier 30, via line 41. A potential applied to the gate of memory cell 10 puts the cell into conduction if the potential is greater than its threshold potential, $V_{t1a}$. Reference cell 20 is the reference cell for memory cell 10 and is used to produce a reference current used to determine the presence of charge on the floating gate of the memory cell. The gate of reference cell 20 is attached to word line 12b, and the drain is coupled to sense amplifier 30, via line 42. A potential applied to the gate of reference cell 20 puts the cell into conduction if the potential is greater than its threshold potential, $V_{t1r}$. When the program state of memory cell 10 is being verified, a gate potential is applied to the word line of memory cell 10, $V_{WL1a}$, and to the word line of reference cell 20, $V_{WL1r}$, to produce a memory cell current, $I_a$, and a reference cell current, $I_r$, respectively. When currents $I_a$ and $I_r$ are conducting, array side load resistance 11 and reference cell side load resistance 21 create voltages $V_+$ and $V_-$. Voltages $V_+$ and $V_-$ represent the input voltages to sense amplifier (SA) 30.

If both cells are conducting, the input voltages to sense amplifier 30 are depicted by the following approximate or first order equations:

$$V_+ = I_a R_a = (\tfrac{1}{2})\beta(V_{WL1a} - V_{t1a})R_a \tag{1}$$

$$V_- = I_r R_r = (\tfrac{1}{2})\beta(V_{WL1r} - V_{t1r})R_r \tag{2}$$

The output signal of the sense amplifier 30, SAout, changes state or "trips" when $V_+$ and $V_-$ are equal:

$$(V_{WLa} - V_{t1a})R_a = (V_{WL1r} - V_{t1r})R_r \tag{3}$$

In the prior art referencing schemes, as alluded to earlier, control of the gate potential had to be well-refined in order to control the position of the erase and program distribution of the "flash" EPROM cell.

Figure 4:
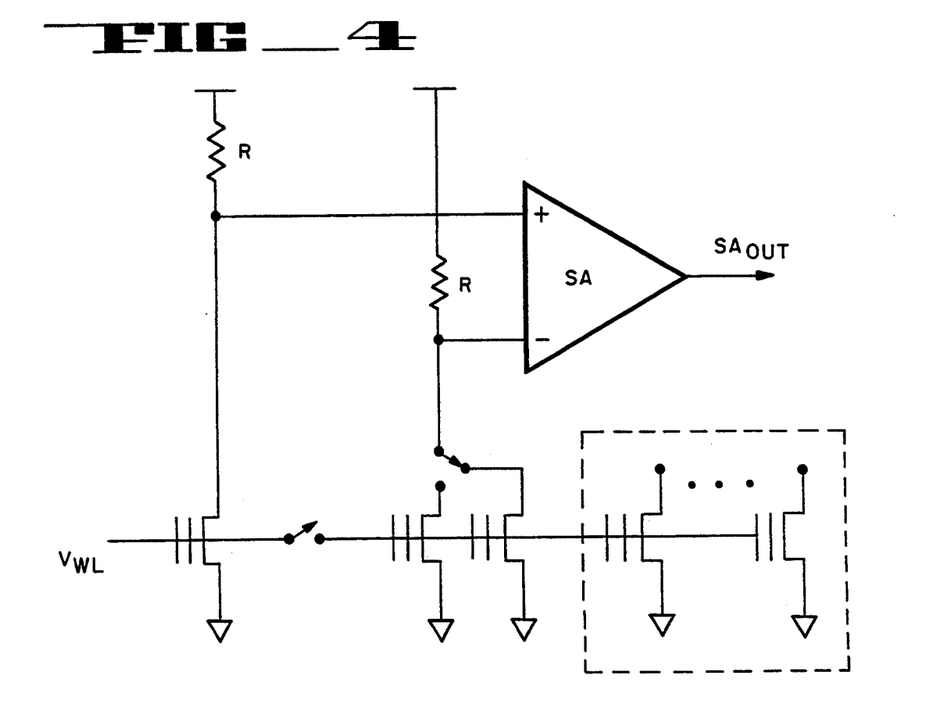
FIG. 4 is a circuit schematic of the present invention during verify operations.

The currently preferred embodiment, shown in FIG. 4, avoids the limitations on the prior art by employing separate reference devices for each operation (e.g., program verify, erase verify, etc.). The reference devices comprising the referencing scheme are identical to the memory devices in both size and structure. The group of reference devices together form an array which may accomplish referencing for each row in the array, for each I/O or group of I/Os, or for the entire array.

The memory cell is shown as device 10. Word line 12 extends over device 10 and other memory cells in the row (not shown) and is attached to the gates of the memory cells in the row. Through ordinary decoding, a row decoder selects a word line in the array. Likewise, a column in the array is selected using a column decoder. This couples memory cell 10 through line 41 to sense amplifier 30. The application of a gate potential on the word line 12 causes a current to be produced by memory cell 10 according to the amount of charge it has (i.e., $V_{WL1a} - V_{t1a}$).

Word line 12 is also coupled to reference devices 20a and 20b (and 20c, etc.) with switching controlled by ordinary transistor and decoder logic. Reference devices 20a and 20b (and 20c, etc.) are matched to the memory cells. Thus, the reference devices are reference cells identical in size and structure to the memory cells. The gates of the reference cells are attached to word line 12 during verify operations by switch 44. Switch 44 consists of ordinary transistor logic. The sources of the reference cells are grounded just like the sources of the memory cells in the array. The drains of the reference cells are attached to switch 43 which couples the reference cells, via line 42, to sense amplifier 30. Switch 43 consists of ordinary transistor logic.

Reference cell 20a represents the erase verify reference cell, while reference cell 20b is the program verify reference cell A read reference cell may be represented by reference device 20c, but the read reference device may take on other more suitable embodiments as will be discussed later (i.e., double-cell read reference device). When word line 12 is selected, any of the reference cells in the referencing scheme (or array) may be selected and coupled to sense amplifier 30, and the corresponding reference current of either device may be compared to the memory cell current produced concurrently.

The memory cell current and the reference current are compared by sense amplifier 30, but they are not compared directly. Sense amplifier 30 compares the potentials produced on lines 41 and 42 by the array cell current and the reference current with respective resistances 11 and 21. In the currently preferred embodiment, resistance 11 of memory cell 10 and resistance 21 for the erase and program verify reference cells (20a and 20b), used to create potentials for sense amplifier 30 comparisons, are equal. This one-to-one ratio allows for verification when memory cell 10 draws more or less current than the reference cell. Thus, the design of sense amplifier 30 is much simpler. Also, since memory cell 10 and reference cells 20a and 20b are fabricated on the same substrate and employ equal loads, temperature tracking exists.

Figure 5:
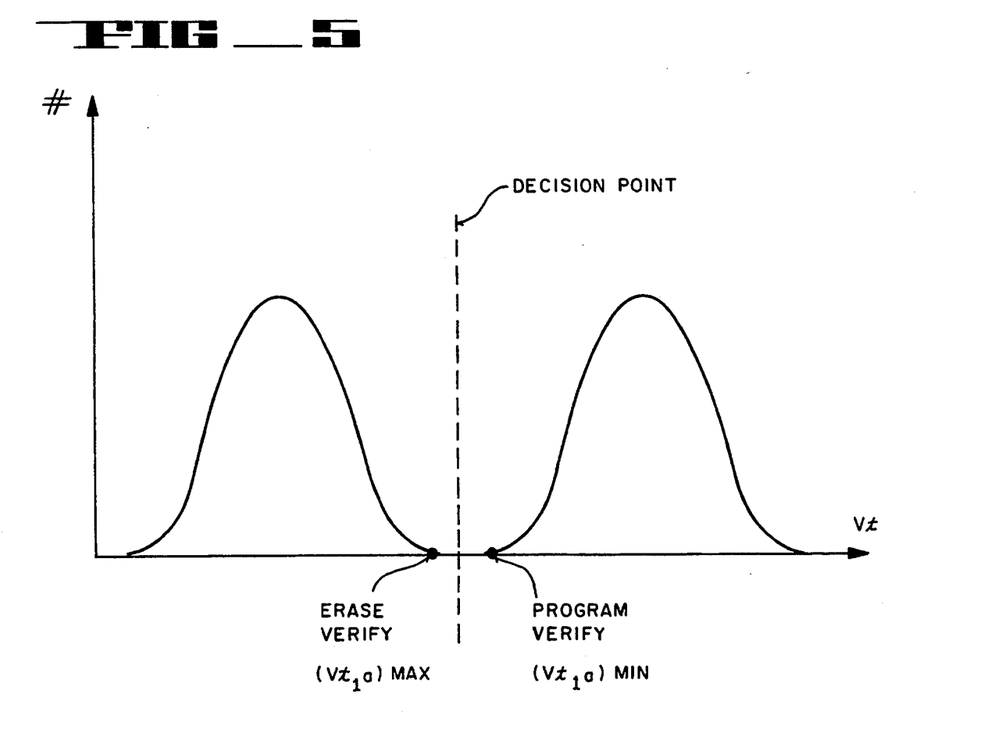
FIG. 5 is a plot of a typical voltage distribution for program and erase verify operations.

Though both reference cells 20a and 20b are identical in size and structure, the reference currents produced by each for the same gate or word line potential are different. The potential appearing on line 42 at sense amplifier 30, attributable to a reference current, is a factor of the gate potential placed on word line 12, the threshold voltage of the reference cell and the load resistance 21. The difference in the reference currents produced by the two reference cells is due to the differences in their threshold voltages. As referred to above, the erase and program verify reference cell threshold voltages are set to the desired top of the erase distribution and the desired bottom of the program distribution for the flash EPROM cell respectively. Performance of the read operation is determined by the effective sensing window (i.e., available signal) as shown in FIG. 5. This is determined by the highest $V_t$ in the erase distribution ($V_{t1a,max}$), the lowest $V_t$ in the program distribution ($V_{t1a,min}$) and the sense-amp ratio (SAR).

The preferred method of setting the threshold voltages of the reference cells is to initially UV or electrically erase the reference cells. Then the transistor of the reference cells are programmed up to the desired threshold voltage by control of the gate and drain voltages. An alternative method of setting the threshold voltages for the reference cells is analog trimming, whereby the transistor in the reference cell is programmed to a certain level above the desired threshold voltage level and then erased to attain that value. For example, to create a program verify reference cell with a threshold voltage of 5.7 volts, the reference transistor must first be programmed to a level above 5.7 volts. To program the reference cell, a high voltage is applied to the control gate of the transistor (e.g., 12V), a lower voltage (e.g., 7V) is applied to the drain region, and the source region is grounded. Under these conditions, the floating gate is negatively charged. Once the charge on the floating gate causes the threshold voltage to be greater than 5.7 volts, the programming is stopped. The drain region is then floated, the control gate is coupled to ground, and a high voltage is applied to the source region. Under these conditions, charge tunnels from the floating gate and erasing occurs. The program verify cell threshold voltage is erased to a voltage of 5.7 volts. Therefore, a transistor reference device with a threshold voltage is created. An erase verify reference cell can be created in the same fashion.

Referring to FIG. 4, assume now that the cells in the array are being programmed and it is necessary to verify that the programming is complete. A memory cell is selected, such as memory device 10, using ordinary decoder logic. This process places a potential on word line 12 which in turn places the potential on the gate of memory device 10. The gate potential on memory device 10 puts memory cell 10 into conduction when the gate potential is greater than the threshold voltage ($V_{t1a}$) of memory cell 10. As shown above in equation (1), this current relates to the gate potential and the threshold voltage of memory cell 10. The memory cell current, in conjunction with resistance 11, creates a potential on line 41 at one of the sense amplifier 30 inputs. Concurrently, the gate potential on the word line 12 appears on the gates of the reference devices. Program verify reference cell 20b conducts a program verify reference current from reference cell 20b. Ordinary decoder logic controls switch 43 to allow sense amplifier 30 to see the reference current. The reference current, in conjunction with resistive element 21, creates another potential at the input of sense amplifier 30 on line 42. Sense amplifier 30 now compares the memory cell current to the program verify reference current. With the gate potential of both memory device 10 and reference cell 20b being the same, when the threshold potential of program verify reference cell 20b is less than that of memory device 10, memory cell 10 draws less current than program verify reference cell 20b. In this case, the programming of memory device 10 is verified and sense amplifier 30 produces the corresponding SAout signal.

Assume now that the cells in the array are being erased and it is necessary to verify that the erasing is complete. A memory cell is selected, such as memory device 10, using ordinary decoder logic. This process places a potential on word line 12 which in turn places the potential on the gate of memory device 10. The gate potential on memory device 10 puts memory cell 10 into conduction when the gate potential is greater than the threshold voltage of memory cell 10. As shown above in equation (1), this current relates to the gate potential and the threshold voltage ($V_{t1a}$) of memory cell 10. The memory cell current, in conjunction with resistance 11, creates a potential on line 41 at one the sense amplifier 30 inputs. Concurrently, the gate potential on the word line 12 appears on the gates of the reference devices. Erase verify reference cell 20a conducts an erase verify reference current. Ordinary decoder logic controls switch 43 to allow sense amplifier 30 to see the reference current from reference cell 20a. The reference current, in conjunction with resistive element 21, creates another potential at the input of sense amplifier 30 on line 42. Sense amplifier 30 now compares the memory cell current to the erase verify reference current. With the gate potential of both memory device 10 and reference cell 20b being the same, when the threshold potential of the erase verify reference cell 20a is greater than that of memory device 10, memory cell 10 draws more current than erase verify reference cell 20a. In this case, erasing of memory device 10 is verified, and sense amplifier 30 produces the corresponding SAout signal.

The read operation occurs in the same manner as the erase verify and program verify operations where a read reference cell, such as 20c, is utilized. Regardless of the gate voltage value, provided the gate voltage is above all of the threshold voltages of the array and reference cells cells, if the threshold potential of the read reference cell 20c is greater than that of memory device 10, the read operation can occur.

Even though a trimmable single cell referencing device can be used to accomplish the read operation, in the currently preferred embodiment, a double-cell read referencing scheme is utilized. Shown in FIG. 6, the double-cell read referencing scheme consists of coupling two reference cells, 20g and 20h, in parallel into sense amplifier 30 with a 2 to 1 sense amplifier ratio (SAR). Reference cells 20g and 20h can be the program verify and erase verify reference cells respectively. Reference cells 20g and 20h can also consist of a program verify reference cell and a single read reference cell, which together produce a read reference cell. The effect of the coupling is to produce a reference current which is the sum of the currents from both the reference cell 20g and 20h divided by a factor of two (the SAR). The plot of the voltage distribution attributed to the double-cell referencing scheme is shown in FIG. 7. Curve A represents the prior art referencing scheme using UV-erased references in a reference column with a SAR of 3 to 1. Curve B represents the read reference current for the single cell referencing scheme described above. Curve C represents the reference current characteristics for the double-cell read referencing scheme. The read reference current curve is normally located between both the erase and program verification reference current distributions.

The double-cell referencing scheme has advantages with respect to the prior art referencing scheme described above. For instance, the risk of reading a programmed cell as erased as high Vcc is eliminated, as shown in FIG. 7. Also, the same temperature and process tracking benefits of the single cell referencing scheme are prevalent in the double-cell referencing scheme. One difference with the single cell referencing scheme is that the double-cell referencing scheme functions at a lower power supply (gate voltage) than the single cell reference.

Figure 6:
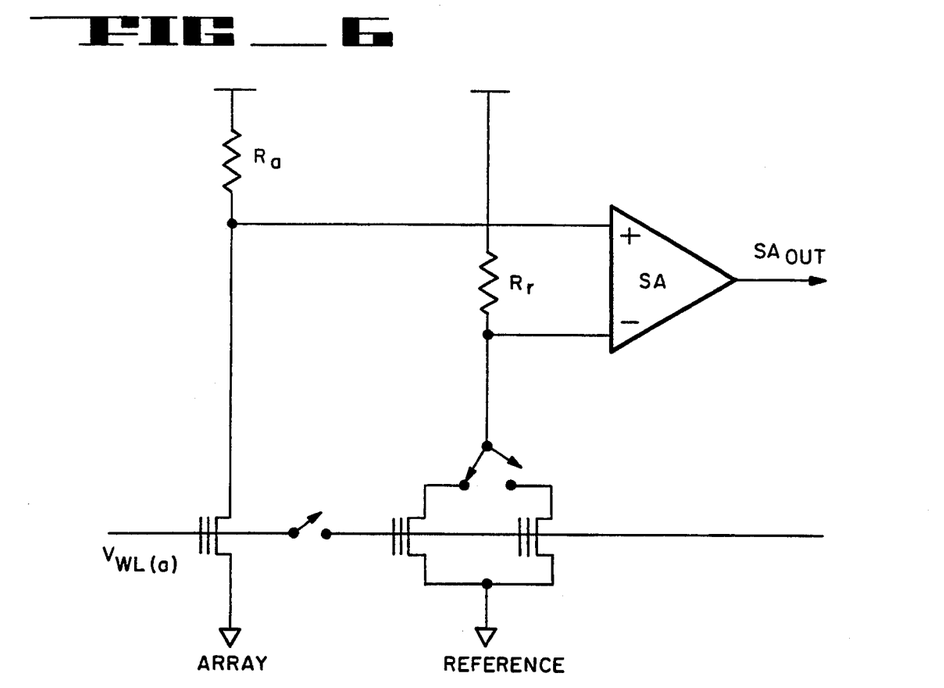
FIG. 6 is a circuit schematic of the double-cell read reference scheme.
Figure 7:
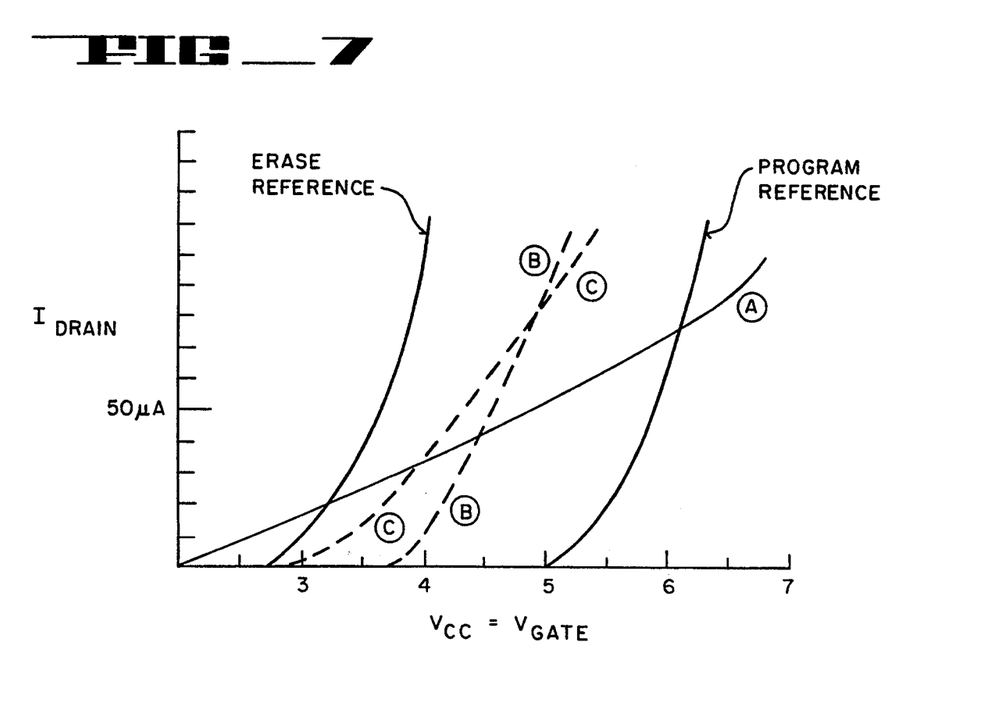
FIG. 7 is a plot of the voltage distribution for the double-cell read reference scheme.

Various variations to the double-cell read referencing scheme exist, the first of which is shown in FIG. 6. In FIG. 6, a program verify reference cell and a read reference cell, 20g and 20h respectively, are coupled in parallel. Switch 43 controls which reference current sense amplifier 30 sees. Another embodiment is to keep the reference column arrangement wherein the reference cell in the column is the erase verify reference cell. Coupled to this erase verify reference cell, through switching, would be a program verify reference cell which could act as a program verify reference or, when coupled by switching to the erase verify reference, could act as the double-cell read reference cell. Another approach is to couple the program and erase verify reference cells in parallel, but give one or the other more weight in the output read referencing current. In this case, the optimum speed of the read reference would dictate the weight each reference cell should have (i.e., other than 0.5 for each in the currently preferred embodiment described earlier). Finally, a four cell referencing scheme is possible. In this case, two reference cells would assume their respective roles as erase and program verify reference cells, while the other two would combine to form the double-cell read reference scheme. Ultimately, the variation used depends on which variation produces the greatest speed for the read operation.

Thus, a circuit for providing voltages which are substantially independent of temperature variations and gate voltages for verifying erasing and programming in flash EPROMs has been described.

We claim:

1. In an electrically erasable and electrically programmable read-only memory (EEPROM) array fabricated on a silicon substrate and having a plurality of memory cells, each of said cells having a floating gate, each of said floating gates coupled to one of a plurality of word lines, a circuit for verifying the state of one of said cells comprising:

first circuit means incorporated on said substrate for providing a first reference current, said first circuit means being coupled to said word line of said one memory cell and having a first threshold potential, said first threshold potential being set to a first predetermined level, such that a first gate potential applied to said word line causes said first circuit means to generate said first reference current where said first gate potential is greater than said first threshold potential and causes said one memory cell to generate a memory cell current;

second circuit means incorporated on said substrate for providing a second reference current, said second circuit means being coupled to said word line of said one memory cell and having a second threshold potential, said second threshold voltage being set to a second predetermined level different from the first predetermined level, such that a second gate potential applied to said word line causes said second circuit means to generate said second reference current where said second gate potential is greater than said second threshold potential and causes said one memory cell to generate a memory cell current; and sensing means coupled to said one memory cell and responsive to said first reference current and said second reference current, said sensing means for comparing said first reference current with said memory cell current, such that said sensing means verifies said program state where said memory cell current is less than said first reference current and for comparing said second reference current and said memory cell current, such that said sensing means verifies said erase state where said memory cell current is greater than said second reference current.

2. The circuit defined in claim 1 further comprising:

third circuit means incorporated on said substrate for providing a third reference current, said third circuit means being coupled to said word line of said one memory cell and having a third threshold potential, said third threshold potential being set to a third predetermined level different from the first predetermined level and the second predetermined level, such that a third gate potential applied to said word line causes said third circuit means to generate said third reference current where said third gate potential is greater than said third threshold potential and causes said one memory cell to generate a memory cell current, wherein said sensing means compares said third reference current and said memory cell current, such that said sensing means reads said one memory cell where said memory cell current is greater than said third reference current; and switching means incorporated on said substrate and coupled to said third circuit means and said sensing means, said switching means for decoupling said first circuit means from said sensing means when said sensing means reads said one memory cell, said switching means for decoupling said third circuit means from said sensing means when said sensing means verifies the program state of said one memory cell.

3. The circuit as described in claim 2 wherein said third circuit means includes said first circuit means coupled to said second circuit means such that said switching means attaches both said first and second circuit means to said sensing means wherein a gate potential applied to said word line and said switching means causes said third circuit means to generate a third reference current consisting of said first and second reference currents where said gate potential is greater than said first threshold potential and causes said one memory cell to generate a memory cell current, such that said sensing means compares said third reference current and said memory cell current to read said one memory cell when said memory cell current is greater than said third reference current.

4. In an electrically erasable and electrically programmable read-only memory EEPROM) array fabricated on a silicon substrate and having a plurality of memory cells, each of said cells having a floating gate, each of said floating gates coupled to one of a plurality of word lines, a circuit for verifying the state of one of said cells comprising:

first circuit means incorporated on said substrate for providing a first reference current, said first circuit means being coupled to said word line of said one memory cell and having a first threshold potential, said first threshold potential being set to a first predetermined level, such that a first gate potential applied to said word line causes said first circuit means to generate said first reference current where said gate potential is greater than said first threshold potential and causes said one memory cell to generate a memory cell current:

second circuit means incorporated on said substrate for providing a second reference current, said second circuit means being coupled to said word line of said one memory cell and having a second threshold potential, said second threshold voltage being set to a second predetermined level different from the first predetermined level, such that a second gate potential applied to said word line causes said second circuit means to generate said second reference current where said second gate potential is greater than said second threshold potential and causes said one memory cell to generate a memory cell current, wherein said sensing means compares said second reference current and said memory cell current, such that said sensing means verifies said erase state where said memory cell current is less than said second reference current:

sensing means coupled to said one memory cell and responsive to said first reference current, said sensing means for comparing said first reference current with said memory cell current and said second reference current with said memory cell current; and switching means incorporated on said substrate and coupled to said sensing means, said first circuit means and said second circuit means, said switching means for decoupling said first circuit means from said sensing means and coupling said second circuit means to said sensing means when said sensing means verifies the erase state of said one memory cell, said switching means for decoupling said second circuit means from said sensing means and coupling said first circuit means to said sensing means when said sensing means verifies the program state of said one memory cell, such that said sensing means verifies said program state where said memory cell current is less than said first reference current and verifies the erase state where said memory cell current is greater than said second reference current.

5. In an electrically erasable and electrically programmable read-only memory (EEPROM) array fabricated on a silicon substrate and having a plurality of memory cells, each of said cells having a floating gate and a resistive means, each of said floating gates coupled to one of a plurality of word lines, a circuit for verifying the program state of one of said cells comprising:

first circuit means incorporated on said substrate for providing a first reference current, said first circuit means including a first transistor matched to said one memory cell, said first transistor having a gate and a first threshold potential, said first threshold potential being set to a first predetermined level, said gate of said first transistor being coupled to said word line of said one memory cell, such that a gate potential applied to said word line causes said first transistor to generate said first reference current where said gate potential is greater than said first threshold potential and causes said one memory cell to generate a memory cell current;

second circuit means incorporated on said substrate for providing a second reference current, said second circuit means including a second transistor matched to said one memory cell, said second transistor having a gate and a second threshold potential, said second threshold voltage being set to a second predetermined level, said gate of said second transistor being coupled to said word line of said one memory cell, such that said gate potential applied to said word line causes said second transistor to generate said second reference current where said gate potential is greater than said second threshold potential and causes said one memory cell to generate a memory cell current;

third circuit means incorporated on said substrate for providing a third reference current, said third circuit means including a third transistor matched to said one memory cell, said third transistor having a gate and a third threshold potential, said third threshold voltage being set to a third predetermined level, said gate of said third transistor being coupled to said word line of said one memory cell, such that said gate potential applied to said word line causes said third transistor to generate said third reference current where said gate potential is greater than said third threshold potential and causes said one memory cell to generate a memory cell current;

sensing means coupled to said one memory cell and coupled to the drains of said first, second and third transistors, said sensing means being responsive to said first, second and third reference currents, said sensing means for comparing said first, second or third reference current with said memory cell current; and switching means incorporated on said substrate for decoupling said second and third circuit means from said sensing means when said sensing means verifies the program state of said one memory cell, said switching means for decoupling said first and third circuit means from said sensing means when said sensing means verifies the erase state of said one memory cell, said switching means for decoupling said first and second circuit means from said sensing means when said sensing means reads said one memory cell; such that said sensing means verifies said program or erase state of or reads said one memory cell where said memory cell current is less than said first reference current, greater than said second reference current, or less than said third reference current respectively.

6. The circuit defined in claim 5 wherein the sources of said first, second and third transistors are coupled to ground.

7. The circuit defined in claim 5 wherein the drains of said first, second and third transistors are coupled to a first, second and third resistive means respectively, said resistive means being matched to the resistive means associated with said one memory cell.

8. In an electrically erasable and electrically programmable read-only memory (EEPROM) array fabricated on a silicon substrate and having a plurality of memory cells, each of said cells having a floating gate and a cell resistive means, each of said floating gates coupled to one of a plurality of word lines, a circuit for verifying the program state of one of said cells comprising:

first circuit means incorporated on said substrate for providing a first reference current, said first circuit means including a first transistor and a first resistive means, said first transistor and said first resistive means being matched to said one memory cell and said cell resistive means respectively, said first transistor having a gate and a first threshold potential, said first threshold potential being set to a first predetermined level, said gate of said first transistor being coupled to said word line of said one memory cell, such that a gate potential applied to said word line causes said first transistor to generate said first reference current where said gate potential is greater than said first threshold potential and causes said one memory cell to generate a memory cell current;

second circuit means incorporated on said substrate for providing a second reference current, said second circuit means including a second transistor and a second resistive means, said second transistor and resistive means being matched to said one memory cell and its cell resistive means respectively, said second transistor having a gate and a second threshold potential, said second threshold voltage being set to a second predetermined level, said gate of said second transistor being coupled to said word line of said one memory cell, such that said gate potential applied to said word line causes said second transistor to generate said second reference current where said gate potential is greater than said second threshold potential and causes said one memory cell to generate a memory cell current;

third circuit means incorporated on said substrate for providing a third reference current, said third circuit means including a third transistor and a third resistive means, said third transistor and resistive means being matched to said one memory cell and its cell resistive means respectively, said third transistor having a gate and a third threshold potential, said third threshold voltage being set to a third predetermined level, said gate of said third transistor being coupled to said word line of said one memory cell, such that said gate potential applied to said word line causes said third transistor to generate said third reference current where said gate potential is greater than said third threshold potential and causes said one memory cell to generate a memory cell current;

sensing means coupled to said one memory cell and coupled to the drains of said first, second and third transistors, said sensing means being responsive to said first, second and third reference currents, said sensing means for comparing said first, second or third reference current with said memory cell current; and switching means incorporated on said substrate for decoupling said second and third circuit means from said sensing means when said sensing means verifies the program state of said one memory cell, said switching means for decoupling said first and third circuit means from said sensing means when said sensing means verifies the erase state of said one memory cell, said switching means for decoupling said first and second circuit means from said sensing means when said sensing means reads said one memory cell, such that said sensing means verifies said program or erase state of or reads said one memory cell where said memory cell current is less than said first reference current, greater than said second reference current, or less than said third reference current respectively.

9. The circuit defined by claim 8 wherein said third resistive means is not equal to said resistive means of said one memory cell.

10. The circuit defined in claim 8 wherein said first, second, and third resistances comprise fourth, fifth and sixth transistors, said fourth, fifth and sixth transistors constituting load transistors such that each of their respective sources are coupled to their gates.

11. In an electrically erasable and electrically programmable read-only memory (EEPROM) array fabricated on a silicon substrate and having a plurality of memory cells, each of said cells having a floating gate and a cell resistive means, each of said floating gates coupled to one of a plurality of word lines, a circuit for verifying the program state of one of said cells comprising:

first circuit means incorporated on said substrate for providing a first reference current, said first circuit means including a first transistor and a first resistive means, said first transistor and said first resistive means being matched to said one memory cell and said cell resistive means respectively, said first transistor having a gate and a first threshold potential, said first threshold potential being set to a first predetermined level, said gate of said first transistor being coupled to said word line of said one memory cell, such that a gate potential applied to said word line causes said first transistor to generate said first reference current where said gate potential is greater than said first threshold potential and causes said one memory cell to generate a memory cell current;

second circuit means incorporated on said substrate for providing a second reference current, said second circuit means including a second transistor and a second resistive means, said second transistor and resistive means being matched to said one memory cell and its cell resistive means respectively, said second transistor having a gate and a second threshold potential, said second threshold voltage being set to a second predetermined level, said gate of said second transistor being coupled to said word line of said one memory cell, such that said gate potential applied to said word line causes said second transistor to generate said second reference current where said gate potential is greater than said second threshold potential and causes said one memory cell to generate a memory cell current, said second circuit means coupled to said first circuit means in parallel, such that said first reference current is generated concurrently with said second reference current when said gate potential is applied, wherein the combination of the two currents constitutes a third reference current;

sensing means coupled to said one memory cell and coupled to the drains of said first and second transistors, said sensing means being responsive to said first, second and third reference currents, said sensing means for comparing said first, second or third reference current with said memory cell current; and switching means incorporated on said substrate for decoupling said second circuit means from said sensing means when said sensing means verifies the program state of said one memory cell, said switching means for decoupling said first circuit means from said sensing means when said sensing means verifies the erase state of said one memory cell, said switching means for coupling said first and second circuit means in parallel to said sensing means to read said one memory cell, such that said sensing means verifies said program or erase state of or reads said one memory cell where said memory cell current is less than said first reference current, greater than said second reference current, or less than said third reference current respectively.

12. In an EEPROM array fabricated on a silicon substrate and having a plurality of memory cells, each of which has a floating gate, each of said floating gates coupled to one of a plurality of word lines, a method for verifying the program and erase states of said memory cells comprising steps of:

selecting one of said memory cells, whereby a first potential is placed on a word line associated with said one of said memory cells, causing a memory cell current to be generated;

producing a first reference current by applying said first potential to the gate of a first reference device, said first reference device having a first threshold potential, said first threshold potential trimmed to a predetermined level;

comparing said memory current with said first reference current;

verifying the program state of said one of said memory cells where said memory current is less than said first reference current;

producing a second reference current by applying said first potential to the gate of a second reference device, said second reference device having a second threshold potential different from the first threshold potential, said second threshold potential trimmed to a predetermined level;

comparing said memory current with said second reference current;

verifying the erase state of said one of said memory cells where said memory current is greater than said second reference current.

13. In an electrically erasable and electrically programmable read-only memory (EEPROM) array fabricated on a silicon substrate and having a plurality of memory cells, each of said cells having a floating gate, each of said floating gates coupled to one of a plurality of word lines, a circuit for verifying the state of one of said cells comprising:

a first transistor incorporated on said substrate to provide a first reference current, said first transistor coupled to said word line of said one memory cell and having a first threshold potential, said first threshold potential being set to a first predetermined level, such that a first gate potential applied to said word line causes said first transistor to generate said first reference current where said first gate potential is greater than said first threshold potential and causes said one memory cell to generate a memory cell current;

a second transistor incorporated on said substrate to provide a second reference current, said second transistor coupled to said word line of said one memory cell and having a second threshold potential, said second threshold voltage being set to a second predetermined level different from the first predetermined level, such that a second gate potential applied to said word line causes said second transistor to generate said second reference current where said second gate potential is greater than said second threshold potential and causes said one memory cell to generate a memory cell current; and a sense amplifier coupled to said one memory cell and responsive to said first reference current and said second reference current, wherein said sense amplifier compares said first reference current with said memory cell current, such that said sense amplifier verifies said program state where said memory cell current is less than said first reference current and compares said second reference current and said memory cell current, such that said sense amplifier verifies said erase state where said memory cell current is greater than said second reference current.

14. The circuit defined in claim 13 further comprising a switch incorporated on said substrate and coupled to said sense amplifiers, said first transistor and said second transistor, wherein said switch decouples said first transistor from said sense amplifier and couples said second transistor to said sense amplifier when verifying the erase state of said one memory cell, and further wherein said switch decouples said second transistor from said sense amplifier and couples said first transistor to said sense amplifier when verifying the program state of said one memory cell.

15. The circuit defined in claim 14 wherein the switch couples the first transistor and the second transistor to the sense amplifier to read said one memory cell.

16. The circuit defined in claim 13 further comprising:

a third transistor incorporated on said substrate to provide a third reference current, said third transistor coupled to said word line of said one memory cell and having a third threshold potential, said third threshold potential being set to a third predetermined level different from the first predetermined level and the second predetermined level, such that a third gate potential applied to said word line causes said third transistor to generate said third reference current where said third gate potential is greater than said third threshold potential and causes said one memory cell to generate a memory cell current, wherein said sense amplifier compares said third reference current and said memory cell current, such that said sense amplifier reads said one memory cell where said memory cell current is less than said third reference current; and a switch incorporated on said substrate and coupled to said first transistor, said second transistor, said third transistor and said sense amplifier, wherein said switch decouples said first transistor and said second transistor from said sense amplifier and couples the third transistor to said sense amplifier when said sense amplifier reads said one memory cell, and further wherein said switch decouples said third transistor and said second transistor from said sense amplifier and couples said first transistor to said sense amplifier when verifying the program state of said one memory cell, and further wherein said switch decouples said third transistor and said first transistor from said sense amplifier and couples said second transistor to said sense amplifier when verifying the erase state of said one memory cell.

17. The circuit defined in claim 13 further comprising:

a third transistor incorporated on said substrate and coupled to said first transistor to provide a third reference current, said third transistor coupled to said word line of said one memory cell and having a third threshold potential, said third threshold potential being set to a third predetermined level different from the first predetermined level and the second predetermined level, such that a third gate potential applied to said word line causes said third transistor and said first transistor to generate said third reference current where said third gate potential is greater than said third threshold potential and causes said one memory cell to generate a memory cell current, wherein said sense amplifier compares said third reference current and said memory cell current, such that said sense amplifier reads said one memory cell where said memory cell current is less than said third reference current; and a switch incorporated on said substrate and coupled to said first transistor, said second transistor, said third transistor and said sense amplifier, wherein said switch decouples said second transistor from said sense amplifier and couples the first transistor and the third transistor to said sense amplifier when said sense amplifier reads said one memory cell, and further wherein said switch decouples said third transistor and said second transistor from said sense amplifier and couples said first transistor to said sense amplifier when verifying the program state of said one memory cell, and further wherein said switch decouples said third transistor and said first transistor from said sense amplifier and couples said second transistor to said sense amplifier when verifying the erase state of said one memory cell.

18. The circuit defined in claim 13 further comprising:

a third transistor and a fourth transistor incorporated on said substrate and coupled together to provide a third reference current, said third transistor and said fourth transistor coupled to said word line of said one memory cell and having a third and fourth threshold potential respectively, said third and fourth threshold potentials being set to a third predetermined level and a fourth predetermined level, respectively, different from the first predetermined level and the second predetermined level, such that a third gate potential applied to said word line causes said third transistor and said fourth transistor to generate said third reference current where said third gate potential is greater than said third threshold potential and causes said one memory cell to generate a memory cell current, wherein said sense amplifier compares said third reference current and said memory cell current, such that said sense amplifier reads said one memory cell where said memory cell current is less than said third reference current; and a switch incorporated on said substrate and coupled to said, first transistor, said second transistor, said third transistor, said fourth transistor and said sense amplifier, wherein said switch decouples said first transistor and said second transistor from said sense amplifier and couples said third transistor and said fourth transistor to said sense amplifier when said sense amplifier reads said one memory cell, and further wherein said switch decouples said second, said third transistor and said fourth transistor from said sense amplifier and couples said first transistor to said sense amplifier when verifying the program state of said one memory cell, and further wherein said switch decouples said first, said third transistor and said fourth transistor from said sense amplifier and couples said second transistor to said sense amplifier when verifying the erase state of said one memory cell.

19. The circuit defined in claim 13 wherein the first transistor and the second transistor comprise n-channel transistors.

20. In an electrically erasable and electrically programmable read-only memory (EEPROM) array fabricated on a silicon substrate and having a plurality of memory cells, each of said cells having a floating gate, each of said floating gates coupled to one of a plurality of word lines, a circuit for verifying the state of one of said cells comprising:

a first transistor incorporated on said substrate to provide a first reference current, said first transistor coupled to said word line of said one memory cell and having a first threshold potential, said first threshold potential being set to a first predetermined level, such that a first gate potential applied to said word line causes said first transistor to generate said first reference current where said first gate potential is greater than said first threshold potential and causes said one memory cell to generate a memory cell current;

a second transistor incorporated on said substrate to provide a second reference current, said second transistor coupled to said word line of said one memory cell and having a second threshold potential, said second threshold voltage being set to a second predetermined level different from the first predetermined level, such that a second gate potential applied to said word line causes said second transistor to generate said second reference current where said second gate potential is greater than said second threshold potential and causes said one memory cell to generate a memory cell current;

a third transistor incorporated on said substrate to provide a third reference current, said third transistor coupled to said word line of said one memory cell and having a third threshold potential, said third threshold potential being set to a third predetermined level different from the first predetermined level and the second predetermined level, such that a third gate potential applied to said word line causes said third transistor to generate said third reference current where said third gate potential is greater than said third threshold potential and causes said one memory cell to generate a memory cell current;

a sense amplifier coupled to said one memory cell and coupled to the sources of said first, second and third transistors, said sense amplifier being responsive to said first, second and third reference currents to determine if said one memory cell is in a first state, a second state or a third state, wherein said sense amplifier compares said first, second or third reference current with said memory cell current; and a switch incorporated on said substrate, wherein said switch decouples said second transistor and said third transistor from said sense amplifier to determine if said one memory cell is in the first state, and wherein said switch decouples said first transistor and said third transistor from said sense amplifier to determine if said one memory cell is in the second state, and further wherein said switch decouples said first transistor and said second transistor from said sense amplifier to determine if said one memory cell is in the third state.

21. The circuit defined in claim 20 wherein the first transistor, the second transistor and the third transistor comprise transistors with threshold voltages trimmed to the first threshold potential, the second threshold potential and the third threshold potential respectively.

22. In an electrically erasable and electrically programmable read-only memory (EEPROM) array fabricated on a silicon substrate and having a plurality of memory cells, each of said cells having a floating gate, each of said floating gates coupled to one of a plurality of word lines, a circuit for verifying the state of one of said cells comprising:

a first transistor incorporated on said substrate to provide a first reference current, said first transistor coupled to said word line of said one memory cell and having a first threshold potential, wherein a first gate potential applied to said word line causes said first transistor to generate said first reference current where said first gate potential is greater than said first threshold potential and causes said one memory cell to generate a memory cell current;

a second transistor incorporated on said substrate to provide a second reference current, said second transistor coupled to said word line of said one memory cell and having a second threshold potential different from the first threshold potential, such that a second gate potential applied to said word line causes said second transistor to generate said second reference current where said second gate potential is greater than said second threshold potential and causes said one memory cell to generate a memory cell current; and a switch incorporated on said substrate and coupled to said first transistor and said second transistor, wherein said switch decouples said first transistor from a node and couples said second transistor to said node to verify the erase state of said one memory cell, and further wherein said switch decouples said second transistor from said node and couples said first transistor to said node to verify the program state of said one memory cell.

23. The circuit defined in claim 22 wherein the switch coupled said first transistor and said second transistor to the node to read said one memory cell.

24. The circuit defined in claim 23 wherein the first transistor and the second transistor comprise transistors with threshold voltages trimmed to the first threshold potential and the second threshold potential respectively.

* * * * *